(12) United States Patent
Yoshida et al.

(10) Patent No.: US 7,232,496 B2
(45) Date of Patent: Jun. 19, 2007

(54) MULTILAYER CERAMIC ELECTRONIC PART, CIRCUIT BOARD AND METHOD FOR PRODUCING CERAMIC GREEN SHEET USED FOR MANUFACTURING THOSE PART AND CIRCUIT BOARD

(75) Inventors: Masayuki Yoshida, Tokyo (JP); Shunji Aoki, Tokyo (JP); Junichi Sutoh, Tokyo (JP); Genichi Watanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/068,781

(22) Filed: Mar. 2, 2005

(65) Prior Publication Data

US 2005/0194084 A1    Sep. 8, 2005

(30) Foreign Application Priority Data

Mar. 3, 2004    (JP) ............................. 2004-058647

(51) Int. Cl.
  *B32B 37/00* (2006.01)
  *B32B 38/00* (2006.01)
  *H01F 41/00* (2006.01)
  *H01G 13/00* (2006.01)

(52) U.S. Cl. ................. 156/89.12; 156/246; 156/275.5; 427/96.1; 430/198; 430/311

(58) Field of Classification Search .............. 156/89.12
See application file for complete search history.

(56) References Cited

U.S. PATENT DOCUMENTS 3,914,128 A * 10/1975 Scheiber et al. ......... 430/288.1

(Continued)

FOREIGN PATENT DOCUMENTS

EP    0 522 622    *    1/1993

(Continued)

OTHER PUBLICATIONS

T. Chartier et al., "UV Curable Systems for Tape Casting," Journal of the European Ceramic Society, vol. 19, No. 1, pp. 67-74, 1999.*

(Continued)

*Primary Examiner*—Melvin Mayes
(74) *Attorney, Agent, or Firm*—Oblon, Spivak, McClelland, Maier & Neustadt, P.C.

(57) ABSTRACT

The present invention provides a method for manufacturing an electronic part that can cope with downsizing, improvement in performance and quality of a multilayer electronic part. A ceramic green sheet is produced by forming on a substrate or on a layer formed on a substrate an internal electrode having a predetermined thickness by a discretional process, forming a photosensitive ceramic slurry on a surface of the substrate or the layer and the internal electrode in such a way that its thickness just before exposure will be substantially equal to or smaller than the thickness of the internal electrode from the surface of the substrate or the layer, irradiating the photosensitive ceramic slurry with light from the upper side of the substrate to perform exposure while masking the internal electrode pattern, to selectively harden the surface of the photosensitive ceramic slurry, the exposure amount being controlled in such a way that the surface of the photosensitive ceramic slurry is hardened, and removing the portion of the photosensitive ceramic slurry that has not been exposed by a development process to expose a surface of the internal electrode pattern.

9 Claims, 3 Drawing Sheets

U.S. PATENT DOCUMENTS

| | | | | |
|---|---|---|---|---|
| 4,336,320 | A | * | 6/1982 | Cummings et al. ......... 430/198 |
| 4,828,961 | A | * | 5/1989 | Lau et al. .................. 430/198 |
| 6,004,705 | A | * | 12/1999 | Masaki et al. ............... 430/15 |
| 6,475,317 | B1 | * | 11/2002 | Baba et al. .............. 156/89.12 |
| 6,602,766 | B2 | * | 8/2003 | Chang et al. ............... 438/496 |
| 2003/0111158 | A1 | * | 6/2003 | Okuyama et al. ........ 156/89.12 |
| 2004/0249040 | A1 | * | 12/2004 | Yamashiki et al. ......... 524/418 |

FOREIGN PATENT DOCUMENTS

| | | | |
|---|---|---|---|
| JP | 1-108003 | * | 4/1989 |
| JP | 5-271576 | | 10/1993 |
| JP | 7-14745 | * | 1/1995 |
| JP | 9-219339 | * | 8/1997 |
| JP | 9-320909 | | 12/1997 |
| JP | 11-330658 | | 11/1999 |
| JP | 2000-36413 | * | 2/2000 |
| JP | 2001-110662 | | 4/2001 |
| KR | 2001-93564 | * | 10/2001 |

OTHER PUBLICATIONS

Patent Abstract of Japan, JP 3216627, Aug. 3, 2001.
Patent Abstract of Japan, JP 3164068, Mar. 2, 2001.
Patent Abstract of Japan, JP 3231987, Sep. 14, 2001.
Patent Abstract of Japan, JP 3292009, Mar. 29, 2002.

* cited by examiner

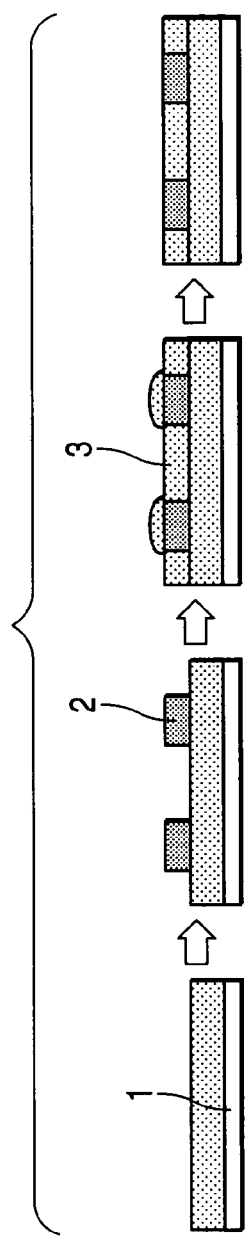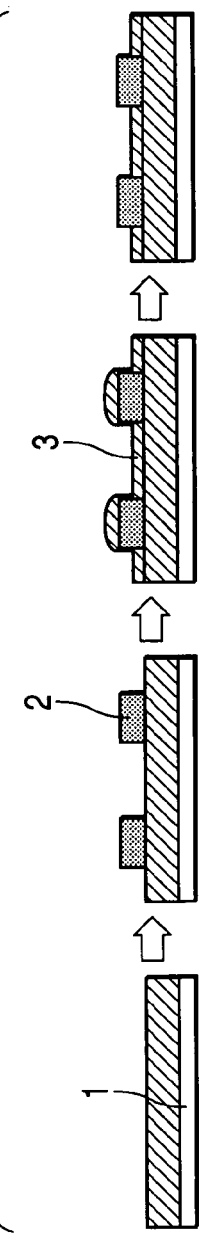

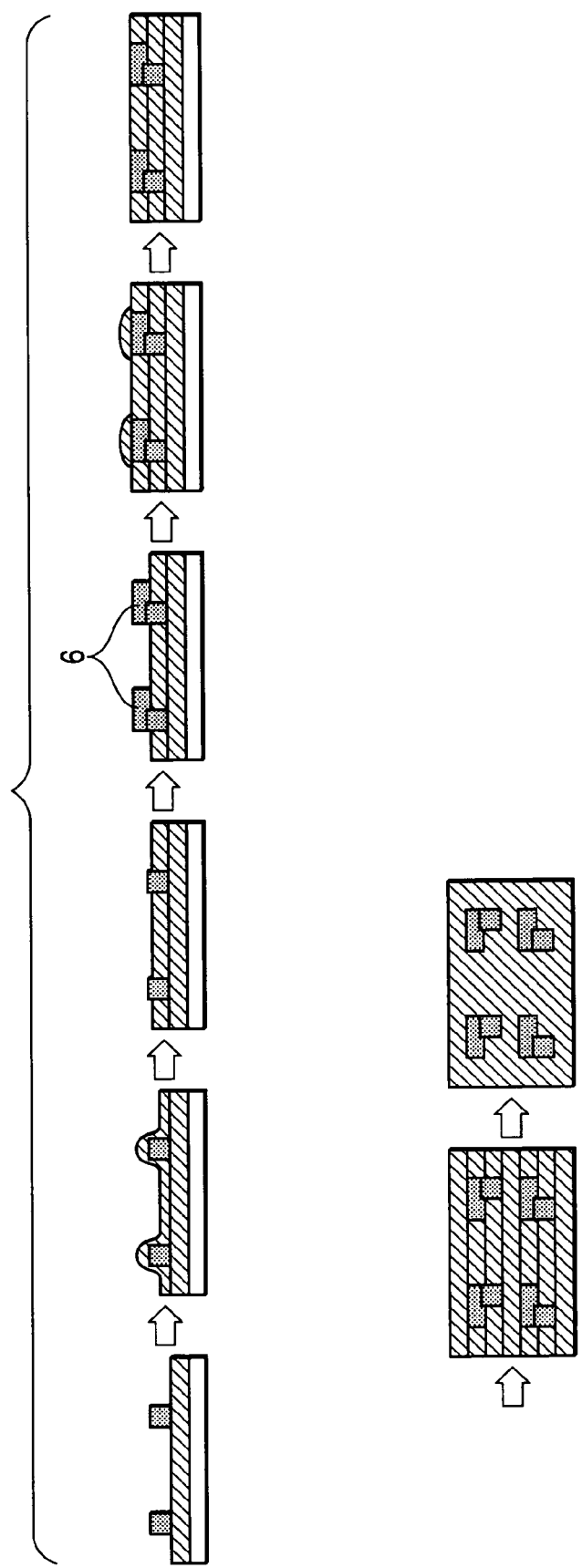

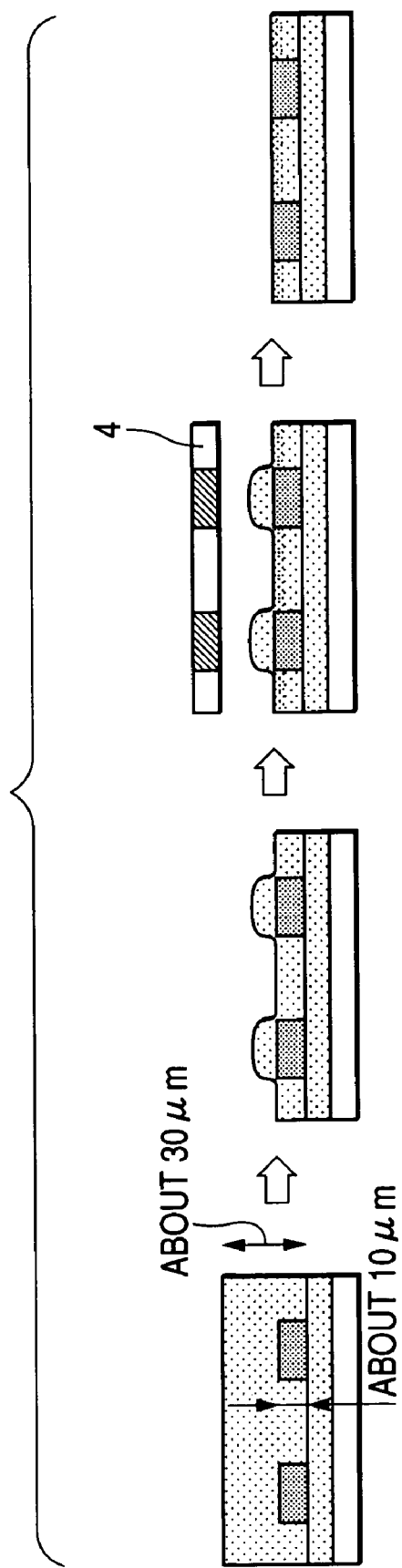

MULTILAYER CERAMIC ELECTRONIC PART, CIRCUIT BOARD AND METHOD FOR PRODUCING CERAMIC GREEN SHEET USED FOR MANUFACTURING THOSE PART AND CIRCUIT BOARD

BACKGROUND OF THE INVENTION

1. Field of the Invention

The present invention relates to a method for manufacturing electronic parts, which are exemplified by electronic parts made of so-called multilayer ceramic formed by laminating ceramic green sheets. More particularly, the present invention relates to a method for manufacturing what is called a ceramic green sheet incorporating an electrode layer inside. Examples of the multilayer ceramic electronic parts described herein include multilayer ceramic capacitors, multilayer ceramic inductors, LC composite parts including them and EMC related parts.

2. Related Background Art

In recent years, with downsizing and rapid popularization of electronic apparatuses represented by cellular phones, an increase in mounting density of the electronic parts used for those apparatuses and improvement in their performance, are required. To meet these requirements, demands for downsizing and improvement in functions, which will be realized by a decrease in the layer thickness and an increase in the number of layers, are placed on multilayer ceramic electronic parts that are used as passive elements. In addition, development of the manufacturing method that can meet these demands is also demanded.

In the following, a method for manufacturing a multilayer ceramic electronic mentioned above will be briefly described taking a multilayer ceramic capacitor having electrodes formed inside it as an example. In this technology, a plurality of electrodes are firstly formed on a ceramic green sheet made of a single ceramic substance at one time by means of a screen printing or the like using an electrically conductive paste containing a metal powder and an organic binder. Subsequently, a plurality of raw ceramic green sheets and ceramic green sheets on which electrodes have been formed etc. are stacked to form a ceramic multilayer member. The electrodes will constitute internal electrodes of multilayer ceramic electronic parts as finished products. Furthermore, the ceramic multilayer member is pressed in its thickness direction so that the green sheets will be brought into close contact with one another. The multilayer member having been brought into close contact is then cut into a certain size and separated into individual chips. External electrodes are suitably formed on the surface of the obtained chips or on the chips having been subjected to sintering. Thus, multilayer ceramic electronic parts are obtained.

There are many reports on methods for producing a ceramic green sheet in connection with multilayer ceramic electronic parts formed by laminating the ceramic green sheets. (See Japanese Patent Nos. 3216627, 3164068 and 3231987 and Japanese Patent Application Laid-Open NO. 2001-110662.)

Among them, a method in which through holes and patterned grooves are formed utilizing a photolithography technique including the process of applying a slurry, drying, exposure and development, and filling with a conductive material is receiving attention. This is because in view of the fact that various electrode patterns formed in a sheet have become finer with downsizing of the multilayer ceramic electronic parts, the photolithography technique is introduced as a method suitable for fine processing.

More specifically, a typical process including the process of applying a photosensitive slurry, forming thereafter a desired electrode pattern by photolithography and filling the negative pattern thus formed with an electrode material.

When the photolithography technique is used, what is important is resolution and light transmissivity.

Resolution has an influence on the precision of the shape of the pattern formed. In the case of a ceramic green sheet having high light diffracting characteristics such as a glass ceramic green sheet, resolution is associated with the problems such as lack of sharpness at the edge of the outer shape of the pattern caused by an influence of diffracted light. Especially, the farther from the exposed side along the sheet thickness direction, the more the influence matters. In other words, there is the problem that portions that need not to be exposed are also exposed due to diffraction caused by the member to be exposed.

Light transmissivity has an influence on the cross sectional shape of the pattern formed. In the case of a ceramic green sheet having a low light transmissivity such as a ferrite ceramic green sheet, light transmissivity is associated with problems such as tapering of the pattern cross section in accordance with a decrease in the light quantity. In this case also, the farther from the exposed side along the sheet thickness direction, the more the influence matters. In other words, there is the problem that portions that are required to be exposed are not exposed due to opacity of the member to be exposed.

In many cases, the aforementioned exposed pattern is filled with an electrically conductive material, and it is desirable that the cross sectional shape of the pattern be rectangular as far as possible, in view of, for example: 1) ease of filling with the electrically conductive paste and 2) reduction of the DC resistance of the electrodes.

In view of the above-described circumstances, when a thick sheet incorporating an electrode pattern etc. is to be formed through the conventional process, a plurality of layers each of which has a thickness that does not affect the resolution and the light transmissivity should be stacked separately or the process including slurry application, exposure, development and electrode printing should be repeated plural times. For example, in the case that a layer with a thickness of 20 µm is to be produced using a material that can transmit or is sensitive to light only up to a thickness of 2 µm, it is necessary with the conventional process to form and stack ten layers. Such a stacking or repeating process invites deterioration of stacking accuracy and is disadvantageous in terms of reliability in electrical conduction characteristics.

In view of the above, a method for producing a ceramic green sheet that is improved in stacking accuracy and electrical conduction reliability while not affected by the resolution and light transmissivity is desired.

As to resolution, solutions such as smoothing the surface of insulating layers and mixing colorant for absorbing reflected light are disclosed in Japanese Patent No. 3216627 and Japanese Patent Application Laid-Open No. 5-271576 (which is cited in Japanese Patent No. 3216627). However, there is no prior art that offers a solution for the problem concerning light transmissivity.

For the problems concerning diffraction in a photosensitive thick film, contamination of a mask in contact exposure and resolution in proximity exposure, Japanese Patent No. 3216627 discloses as a solution a method for manufacturing an inductor. In this method, a photosensitive, electrically conductive thick film is formed, then it is subjected to smoothing and a pattern is formed therein by exposure using a mask and development, a photosensitive insulating thick film is formed thereon, then it is subjected to smoothing and a through holes are formed by exposure and development, a photosensitive, electrically conductive thick film is formed thereon to fill the through holes, then it is subjected to smoothing and a pattern is formed by exposure and development. This method utilizes the method of forming a photosensitive insulating film on a conductive material pattern, then exposing and developing it. However, the photosensitive insulating film on the conductive material pattern is formed as a thick layer and through holes are formed by exposure and development. Accordingly, there is a demand for a simpler process having wider applicability.

The technology disclosed in Japanese Patent No. 3164068 has as an object to increase the thickness of the conductive material pattern. In the method disclosed in this document, an electronic part is manufactured by repeatedly performing the process of forming a photosensitive electrically conductive thick film, subsequently forming a pattern therein by exposure using a mask and development, forming a film of an insulating material thereon, then removing the insulating layer using a solvent until the upper surface of the underlying lower conductor pattern is exposed, forming an upper conductive pattern layer on the lower conductive pattern, forming a photosensitive insulating thick film thereon, then forming via holes by exposure and development, forming a photosensitive, electrically conductive layer, and filing the via holes by exposure using a mask and development. However, according to this method, the film thickness is decreased since portions of the insulating film other than the portion on the conductor pattern are also dissolved, and therefore there is the problem of stack misalignment.

Japanese Patent No. 3231987 discloses a method for manufacturing a ceramic circuit board in which a laminated member is formed by repeatedly performing the process of applying a photosensitive ceramic slip material (considered to refer to slurry), forming a pattern groove for internal wiring by exposure and development and thereafter filling the groove with conductive paste, and the laminated member thus formed is sintered. This method is developed from the printing-lamination method, and it forms a laminated member in a building-up manner. In other words, in forming laminated layers successively, formation of one layer is not completed unless all of the sequential process steps of application, drying, exposure, development, liquid removal or drying, filling with conductor, drying, filling with resin and drying (or exposure). Therefore, according to this prior art, if a defective layer is generated in the course of the process, all the layers that have been formed up to then may sometimes be wasted, and it is disadvantageous in lead time and yield.

Japanese Patent Application Laid-Open No. 2001-110662discloses a method for manufacturing a part incorporating an inductor in which a photosensitive slurry is applied on an electrically conductive processing material, a pattern groove is formed thereon by exposure and development, electrodes are formed in the groove by electrodeposition, layers formed in this way are stacked and then sintered. However, this method suffers from the problems that the thickness (or the resolution or diffraction characteristics) of the insulating layer affects the cross sectional shape of the internal electrode pattern and that the number of the process step increases. Furthermore, in this method there are restrictions due to resolution dependency in resolving at high aspect and production of thick layers in the case of the application of the photosensitive slurry and the electrodeposition of the photosensitive powder.

SUMMARY OF THE INVENTION

The present invention has been made in view of the above-described background and has as an object to provide a method for manufacturing an electronic part that can prevent stack misalignment and in which various photosensitive materials can be used without giving consideration to their light transmissivity. Specifically, with the method of the present invention, even when a material used has such a low transmissivity that a thickness of only one or a few micrometers at most can be hardened under an abundant light quantity, a sheet having a sufficient thickness and incorporating electrodes can be formed at one exposure and development so long as a hardened film that tolerates development is formed, and the method is advantageous in terms of stacking accuracy and conduction reliability. In addition, even materials such as glass ceramic materials that are easy to diffract light can be used so long as conditions concerning resolution at transmission thickness and tolerance against development are met, and it can be applied to processes for manufacturing most of products by arranging the mask used and manufacturing conditions.

According to the present invention, there is provided a method for producing a ceramic green sheet used for manufacturing of a multilayer ceramic electronic part, comprising the steps of, forming on a substrate or on a layer formed on a substrate an internal electrode having a predetermined thickness by a discretional process, forming a photosensitive ceramic slurry on a surface of the substrate or the layer and the internal electrode in such a way that its thickness just before exposure will be substantially equal to the thickness of the internal electrode from the surface of the substrate or the layer, irradiating the photosensitive ceramic slurry with light from the upper side of the substrate to perform exposure while masking the internal electrode pattern, to selectively harden the surface of the photosensitive ceramic slurry, the exposure amount being controlled in such a way that the surface of the photosensitive ceramic slurry is hardened, and removing the portion of the photosensitive ceramic slurry that has not been exposed by a development process to expose a surface of the internal electrode pattern.

According to another aspect of the present invention, there is provided a method for producing a ceramic green sheet used for manufacturing of a multilayer ceramic electronic part, comprising the steps of, forming on a substrate or on a layer formed on a substrate an internal electrode having a predetermined thickness by a discretional process, forming a photosensitive ceramic slurry on a surface of the substrate or the layer and the internal electrode in such a way that its thickness just before exposure will be smaller than the thickness of the internal electrode from the surface of the substrate or the layer, irradiating the photosensitive ceramic slurry with light from the upper side of the substrate to perform exposure while masking the internal electrode pattern, to selectively harden the surface of the photosensitive ceramic slurry, the exposure amount being controlled in such a way that the surface of the photosensitive ceramic slurry is hardened, and removing the portion of the photosensitive ceramic slurry that has not been exposed by a development process to expose a surface of the internal electrode pattern.

According to another aspect of the present invention, there is provided a method for producing a ceramic green sheet used for manufacturing of a multilayer ceramic electronic part, comprising the steps of, forming a pattern electrode on an exposed post electrode of a ceramic green sheet produced by the above-described method, forming a photosensitive ceramic slurry on a surface of the pattern electrode in such a way that its thickness just before exposure will be substantially equal to the thickness of the pattern electrode, irradiating the sheet thus formed with light from the upper side of the substrate to perform exposure while masking the internal electrode pattern, to selectively harden the surface of the photosensitive ceramic slurry, the exposure amount being controlled in such a way that the surface of the photosensitive ceramic slurry is hardened, and removing the portion of the photosensitive ceramic slurry that has not been exposed by a development process to expose a surface of the internal electrode pattern.

According to one aspect of the present invention, in the above-described methods for producing a ceramic green sheet the internal electrode may be formed by either one of screen printing, ink jet, photolithography of a photosensitive electrode material, metal plating, electrophoretic deposition and sputtering or a combination thereof.

According to another aspect of the present invention, there is provided a method for manufacturing a multilayer ceramic electronic part, wherein the multilayer ceramic electronic part is produced by stacking ceramic green sheets formed by the above-described method for producing a ceramic green sheet or a set of ceramic green sheets including a ceramic green sheet formed by a different producing method.

According to the method for manufacturing an electronic part using a ceramic green sheet, stack misalignment can be prevented and various photosensitive materials can be used without giving consideration to their light transmissivity.

The method for producing a ceramic green sheet according to the present invention includes the steps of, forming on a substrate or on a layer formed on a substrate an internal electrode having a predetermined thickness by a discretional process, forming a photosensitive ceramic slurry on a surface of the substrate or the layer and the internal electrode in such a way that its thickness just before exposure will be substantially equal to or smaller than the thickness of the internal electrode from the surface of the substrate or the layer, irradiating the photosensitive ceramic slurry with light from the upper side of the substrate to perform exposure while masking the internal electrode pattern to selectively harden the surface of the photosensitive ceramic slurry, the exposure amount being controlled in such a way that the surface of the photosensitive ceramic slurry is hardened, and removing the portion of the photosensitive ceramic slurry that has not been exposed by a development process to expose a surface of the internal electrode pattern. With the method of the present invention, it is possible to form an internal electrode pattern without an influence by light resolution or light transmissivity of the photosensitive ceramic green sheet on the cross sectional shape of the electrode pattern. Therefore, it is possible to form an internal electrode pattern even if the sheet is dark colored or thick.

The exposure amount should be sufficient for hardening the surface of the photosensitive ceramic slurry, namely sufficient for hardening such a thickness of the photosensitive slurry after exposure that the desired portion thereof will not be dissolved by developing solution in the development process.

The cross sectional shape of the internal electrode pattern depends on the method for forming the internal electrode. The method may be screen printing, ink jet, photolithography of a photosensitive electrode material, metal plating, electrophoretic deposition, sputtering etc. or a combination of these methods. What is particularly suitable is a method with which the shape of the cross section of the conductive portion formed is as close to a rectangular shape as possible and a high aspect ration can be achieved.

Furthermore, a photosensitive green sheet may be formed over the internal electrode in such a way that its thickness just before exposure will be substantially equal to the thickness of the internal electrode. Thus, a substantially flat ceramic green sheet incorporating the internal electrode can be produced.

In the method of the present invention, the photosensitive ceramic slurry is applied and dried in such a way that the height of the green sheet portion and the height of the internal electrode will be substantially the same as each other after exposure and development, and it is subjected to exposure using an electrode pattern mask and development to produce a substantially flat layer incorporating the electrode. The thickness of the slurry applied should be a little larger than thickness of the electrode so that it will be substantially equal to the thickness of the electrode and the height of the green portion and the height of the electrode will be substantially the same as each other after exposure and development. In the case that a decrease in the layer thickness of the portion hardened by the exposure occurs due to dissolution in the development, the thickness of the dried slurry may be larger than the thickness of the electrode by an amount corresponding to an amount that will be decreased by the dissolution. By stacking layers that have been made substantially flat in this way, stack misalignment can be reduced and precision of the dimension of sintered member can be further enhanced.

Furthermore, the present invention can be applied to an electrode that are formed on a substrate made of for example PET. Any type of substrate can be used so long as an electrode can be formed thereon. The electrode may be formed by printing or transferring. The present invention can also be applied to a substrate on which an electrode or the like is formed by electrodeposition. In this case, it is possible to form a layer incorporating an electrode while maintaining the precision of the electrode formed by electrodeposition. Thus, electric characteristics thereof can be further improved.

Furthermore, the present invention can be applied irrespective of whether the material has a high transmissivity or a low transmissivity for the exposure light. Specifically, the present invention can be applied to magnetic materials, dielectric materials, and products or substrates containing these materials. Therefore, the present invention can be implemented in the same process and it is possible to use a common production line. Thus, the equipment cost can be reduced.

Since the present invention requires only to harden the surface of a photosensitive material, resolution is unlikely to be affected by diffraction that occurs in the photosensitive material upon exposure. Resolution is generally deteriorated along the thickness direction due to diffraction by the material. However, in the method of the present invention, deterioration of resolution affects little since a hardened film with a thickness of few micrometers is formed by exposure.

The present invention can be applied to an electrode formed on a green sheet irrespective of the light transmissivity of the photosensitive material. The green sheet may have a through hole formed thereon and have a structure including a pattern and a post, which results in improved conduction reliability. According to the present invention it is further possible to provide a sheet incorporating a structure including a pattern and a post without forming a through hole or a pattern groove and irrespective of the light transmissivity and pattern resolution of the material. This leads to further improvement in conduction reliability.

BRIEF DESCRIPTION OF THE DRAWINGS

FIG. 1 is a flow diagram of a process of producing a ceramic green sheet according to the present invention.

FIG. 2 is a flow diagram showing another process of producing a ceramic green sheet according to the present invention.

FIG. 3 is a flow chart showing another process of producing a ceramic green sheet according to the present invention.

FIG. 4 is a flow diagram showing exposure of a ceramic green sheet using a mask according to the present invention.

DESCRIPTION OF THE PREFERRED EMBODIMENTS

In the following, embodiments of the present invention will be specifically described with reference to the annexed drawings. FIGS. 1 to 4 are flow diagrams showing the principal steps of the electronic part manufacturing processes according to the present invention. Each of the drawings in FIGS. 1 to 4 shows a cross section of the principal portion of a substrate and sheet etc.

Embodiment 1

As shown in FIG. 1, internal electrodes 2 having a predetermined thickness are formed on a substrate 1 by a discretional process. Then slurry of a photosensitive ceramic 3 is applied on the surface of the internal electrodes. The slurry is dried so that the thickness thereof just before exposure will be substantially equal to the thickness of the internal electrodes. Subsequently, the photosensitive ceramic slurry is irradiated with light from the upper side of the substrate to effect exposure while the internal electrode pattern is masked by a photo mask 4 as shown in FIG. 4. In this process, the surface of the photosensitive ceramic slurry is selectively hardened while controlling the exposure amount in such a way that the exposed portion on the surface of the photosensitive ceramic slurry is hardened. The portion of the photosensitive ceramic slurry that has not been exposed is removed by development process to produce a substantially flat layer incorporating internal electrodes.

Circuit boards or electronic parts etc. are formed by stacking a plurality of photosensitive ceramic green sheets thus formed and pressing and sintering it.

FIG. 4 shows the factors that determine the thickness of the photosensitive slurry in the ceramic green sheet according to the present invention and the mask exposure process. In the case that the thickness of the internal electrodes is approximately 10 μm, the photosensitive slurry is applied at a thickness of approximately 30 μm. When the slurry thus applied is dried, the photosensitive slurry contracts (at a contraction ratio of about 1/3) and the resultant thickness of the slurry on the internal electrodes is approximately 7 μm. After the slurry is thus dried, the sheet is selectively exposed using the photo mask. Then, it is subjected to development process to remove the portion of the photosensitive ceramic slurry that has not been exposed. Thus, the surface of the internal electrode pattern is exposed.

FIGS. 1 and 4 and FIGS. 2 and 3, which will be described later, show the cases in which the substrate 1 contains a layer made of a photosensitive ceramic slurry in which electrodes are to be formed. This layer in which electrodes are to be formed may be made of a glass ceramic material or a ferrite material. In addition, a through hole(s) may be formed in this layer. These types of the layer in which electrodes are to be formed may be selected suitably in accordance with the multilayer ceramic electronic parts etc. to be manufactured.

Embodiment 2

As shown in FIG. 2, internal electrodes 2 having a predetermined thickness 2 are formed on a substrate 1 by a discretional process. Then slurry of a photosensitive ceramic 3 is applied on the surface of the internal electrodes. The slurry is dried so that the thickness thereof just before exposure will be smaller than the thickness of the internal electrodes. Subsequently, the photosensitive ceramic slurry is irradiated with light from the upper side of the substrate to effect exposure while the internal electrode pattern is masked by a photo mask 4 as shown in FIG. 4. In this process, the surface of the photosensitive ceramic slurry is selectively hardened while controlling the exposure amount in such a way that the exposed portion on the surface of the photosensitive ceramic slurry is hardened. The portion of the photosensitive ceramic slurry that has not been exposed is removed by development process to expose the internal electrode pattern.

Circuit boards or electronic parts etc. are formed by stacking a plurality of photosensitive ceramic green sheets thus formed and pressing and sintering it.

Embodiment 3

As shown in FIG. 3, internal electrodes 2 having a predetermined thickness are formed on a substrate 1 by a discretional process. Then slurry of a photosensitive ceramic 3 is applied on the surface of the internal electrodes. The slurry is dried so that the thickness thereof just before exposure will be smaller than the thickness of the internal electrodes. Subsequently, the photosensitive ceramic slurry is irradiated with light from the upper side of the substrate to effect exposure while the internal electrode pattern is masked by a photo mask 4 as shown in FIG. 4. In this process, the surface of the photosensitive ceramic slurry is selectively hardened while controlling the exposure amount in such a way that the exposed portion on the surface of the photosensitive ceramic slurry is hardened. The portion of the photosensitive ceramic slurry that has not been exposed is removed by development process to expose the internal electrode pattern. On the post electrodes thus formed, pattern electrodes 6 are formed. Then, photosensitive slurry is applied thereon in a manner similar to in embodiment 1, and it is subjected to selective exposure. After that, development process for removing the slurry on the pattern electrodes is effected to form a substantially flat layer incorporating the pattern electrodes and the post electrodes.

Further, the layer incorporating the pattern electrodes and the post electrodes may be formed in the manner that as shown in Embodiment 1 (FIG. 1), the slurry of a photosensitive ceramic is applied on the surface of the internal electrodes 2 (post electrodes) so that the thickness of the slurry will be substantially equal to the thickness of the internal electrodes and then in the same manner as that in this embodiment on such layer the pattern electrodes are formed.

A circuit board or electronic parts etc. are formed by stacking a plurality of layers thus formed and pressing and sintering it.

According to the method of producing a so-called ceramic green sheet incorporating a electrode layer inside, which may be used as a raw material in manufacturing multilayer electronic parts, according to the present invention, stack misalignment can be prevented and various photosensitive materials can be used without giving consideration to their light transmissivity. Therefore, the method of the present invention can be suitably applied to manufacturing of multilayer ceramic electronic parts such as multilayer ceramic capacitors, multilayer ceramic inductors, LC composite parts incorporating them, and EMC related parts.

What is claimed is:

1. A method for producing a ceramic green sheet used for manufacturing of a multilayer ceramic electronic part, comprising the steps of:

forming on a substrate or on a layer formed on a substrate an internal electrode having a predetermined thickness by a discretional process;

forming a photosensitive ceramic slurry on a surface of said substrate or said layer and said internal electrode in such a way that its thickness just before exposure will be substantially equal to the thickness of said internal electrode from the surface of said substrate or said layer;

irradiating said photosensitive ceramic slurry with from the upper side of said substrate to perform exposure while masking said internal electrode, to only harden the surface of said photosensitive ceramic slurry, the exposure amount being controlled in such a way that the surface surface of the photosensitive ceramic slurry is hardened: and removing the portion of said photosensitive ceramic slurry that has been exposed by a development process to expose a surface of the internal electrode.

2. A method for producing a ceramic green sheet used for manufacturing a multilayer ceramic electronic part, comprising the steps of:

forming on a substrate or on a layer formed on a substrate an internal electrode having a predetermined thickness by a discretional process;

forming a photosensitive ceramic slurry on a surface of said substrate or said layer and said internal electrode in such a way that its thickness just before exposure will be smaller than the thickness of said internal electrode from the surface of said substrate or said layer;

irradiating said photosensitive ceramic slurry with the light from the upper side of said substrate to perform exposure while masking said internal electrode, to only harden the surface of said photosensitive ceramic slurry, the exposure amount being controlled in such a way that the surface of the photosensitive ceramic slurry is hardened; and removing the portion of said photosensitive ceramic slurry that has not been exposed by a development process to expose a surface of the internal electrode.

3. A method for producing a ceramic green sheetused for manufacturing a multilayer ceramicelectronuic part, comprising the steps of:

forming a pattern electrode on an exposed electrode of a ceramic green sheet produced by a method according to claim 1 or 2;

forming a photosensitive ceramic slurry on a surface of said pattern electrode in such a way that its thickness just before exposure will be substantially equal to the thickness of said pattern electrode;

irradiating the sheet thus formed with light from the upper side of said substrate to perform exposure while masking said pattern electrode, to selectively harden the the surface of said photosensitive ceramic slurry, the exposure amount being contolled in such a way that the surface of the photosensitive ceramic slurry is hardened; and removing the portion of said photosensitive ceramic slurry that has not been exposed by a development process to expose a surface of thepattern electrode.

4. A method for producing a ceramic green sheet according to claim 3, wherien said internal electrode is formed by either one of screen printing, ink jet photolithography of a photopsensitive electrode material, metal plating, electrphoretic deposition and sputtering therof.

5. A method for manufacturing a multilayer ceramic electronic part, wherein the multilayer ceramic electronic part is produced by stacking ceramic green sheets formed by a method for producing a ceramic green sheet according to claim 4 or a set of ceramic green sheets including a ceramic green sheet formed by a method for producing a ceramic green sheet according to claim5 and a ceramic green sheet formed by a different producing method.

6. A method for manufacturing a multilayer ceramic electronic part, wherein the multilayer ceramic electronic part is produced by stacking ceramic green sheets formed by a method for producing a ceramic green sheet according to claim 3 or a set of ceramic green sheets including a ceramic green sheet formed by a method for producing a ceramic green sheet according to claim 3 and a ceramic green sheet formed by a different producing method.

7. A method for producing a ceramic green sheet according to any one of claims 1 or 2, wherein said internal electrode is formed by either one if screen printing, ink jet, photolithography of a photsensitive electrode material, metal plating, electrophoretic deposition and sputtering or a combination therof.

8. A method for manufacturing a multilayer ceramic electronic part, wherein the multilayer ceramic electronic part is produced by stacking ceramic green sheets formed by a method for producing a ceramic green sheet according to claim 7 or a of set ceramic green sheets including a ceramic green sheet formed by a method for produced a ceramic green sheet according to claim 4 and a ceramic green sheet formed by a different producing method.

9. A method for manufacturing a multilayer ceramic electronic part, wherein the multilayer ceramic electronic part is produced by stacking ceramic green sheets formed by a method for producing a ceramic green sheet according to any one of claims 1 or 2 or a set of ceramic green sheets including a ceramic green sheet formed by a method for producing a ceramic green sheet according to any of claims 1 to 2 and a ceramic ceramic green sheet formed by a different producing method.

* * * * *